United States Patent [19]

Wu

[11] Patent Number: 5,789,816

[45] Date of Patent: Aug. 4, 1998

[54] MULTIPLE-CHIP INTEGRATED CIRCUIT PACKAGE INCLUDING A DUMMY CHIP

[75] Inventor: Ching-Yi Wu, Chungli, Taiwan

[73] Assignee: United Microelectronics Corporation, Hsinchu, Taiwan

[21] Appl. No.: 749,779

[22] Filed: Nov. 15, 1996

[30] Foreign Application Priority Data

Oct. 4, 1996 [TW] Taiwan ................. 85112173

[51] Int. Cl.$^6$ ........................... H01L 23/34
[52] U.S. Cl. ........................... 257/723; 257/724
[58] Field of Search ..................... 257/723, 724, 257/676, 773, 780

[56] References Cited

U.S. PATENT DOCUMENTS

| | | | |
|---|---|---|---|
| 5,075,758 | 12/1991 | Aizawa | 257/780 |
| 5,084,753 | 1/1992 | Goida et al. | 257/723 |
| 5,245,216 | 9/1993 | Sako | 257/723 |
| 5,373,188 | 12/1994 | Michii et al. | 257/773 |

*Primary Examiner*—Jerome Jackson
*Assistant Examiner*—Nathan K. Kelley
*Attorney, Agent, or Firm*—Rabin, Champagne & Lynt, P.C.

[57] ABSTRACT

A multiple-chip IC package used to contain a number of chips therein is provided. The multiple-chip IC package includes a leadframe, at least one IC chip mounted on the leadframe, and at least one dummy chip mounted on a second area on the leadframe. On the dummy chip, there is provided with a plurality of bonding pads which serve as intermediate bonding pads between the chips and the pins on the leadframe so that any two connecting points are connected by a number of straight wires via the dummy chip. This allows the wire bonding process to be much easier to conduct. Further, the method for assembling this multiple-chip IC package includes a first step of mounting the chips on a leadframe; a second step of mounting at least one dummy chip having a plurality of bonding pads thereon on a selected area on the leadframe; and a third step of conducting a wire bonding process to interconnect between the chips and the pins.

7 Claims, 3 Drawing Sheets

5,789,816

MULTIPLE-CHIP INTEGRATED CIRCUIT PACKAGE INCLUDING A DUMMY CHIP

BACKGROUND OF THE INVENTION

1. Field of the Invention

This invention relates to integrated circuit (IC) packages, and more particularly, to a multiple-chip IC package which can be used to contain a number of chips therein and which allows the wire bonding process for interconnection between different chips and between chips and pins to be simplified.

2. Description of Related Art

Present semiconductor technology has advanced to submicron levels to provide very high integration of IC chips. These chips can be made very small in feature size while providing increased functionality. Several such IC chips can now be packaged in a single IC package which offers an increased level of functionality only achieved by conventional technology by providing several circuit boards. A conventional method for packaging a number of chips in a single IC package is to first mount the chips on a printed circuit board (CB) made of polyimide or glass epoxy and then use copper wires to provide interconnect between different chips and between chips and the pins.

FIG. 1 shows a conventional multiple-chip IC package method which contains two chips 120 and 130 mounted on a leadframe 110. The leadframe 110 has a number of pins on the four edges thereof for electrically interconnecting the IC package to external circuits. Each of the chips, 120 and 130, has its bonding pads wire connected to corresponding pins on the edges of the leadframe 110.

One major drawback of the conventional multiple-chip IC package of FIG. 1 is that, with the chips being made smaller and smaller, the wire bonding for interconnecting the bonding pads on the chips onto the pins on the leadframe is becoming a high precision process in which very thin wires now must be used. This process is very complex and thus very costly to implement, whereby the manufacturing cost of the IC packages is very high. Moreover, if the wires connecting the chips to the pins on the leadframe are too lengthy, the functionality of the chips could be affected.

SUMMARY OF THE INVENTION

It is therefore a primary objective of the present invention to provide a multiple-chip IC package which is capable of accommodating a number of chips therein and which allows the wire bonding process to be simplified in complexity, so as to maintain reasonable manufacturing cost.

It is still another objective of the present invention to provide a method for assembling the foregoing multiple-chip IC package.

In accordance with the foregoing and other objectives of the present invention, an improved multiple-chip IC package and a method for assembling the same is provided.

The multiple-chip IC package includes a leadframe having a plurality of pins on the edge thereof. At least one IC chip having a plurality of first bonding pads thereon is mounted on a first area of the leadframe. Additionally, at least one dummy chip having a plurality of second bonding pads thereon is mounted on a second area on the leadframe. A plurality of first wires are used to interconnect a selected group of the first bonding pads on the IC chip to a first selected group of the second bonding pads on the dummy chip; and a plurality of second wires are used to interconnect the first selected group of second bonding pads to a second selected group of bonding pads on the dummy chip. Moreover, a plurality of third wires are used to interconnect the second selected group of bonding pads on the dummy chip to a selected group of pins on the leadframe.

The provision of the dummy chip allows the interconnection between chips and pins to be simplified, so that the bonding wires can be reduced in length as well as in wiring complexity.

BRIEF DESCRIPTION OF DRAWINGS

The invention can be more fully understood from the following detailed description of the preferred embodiments, with reference made to the accompanying drawings, wherein.

DETAILED DESCRIPTION OF PREFERRED EMBODIMENT

Figure 1:
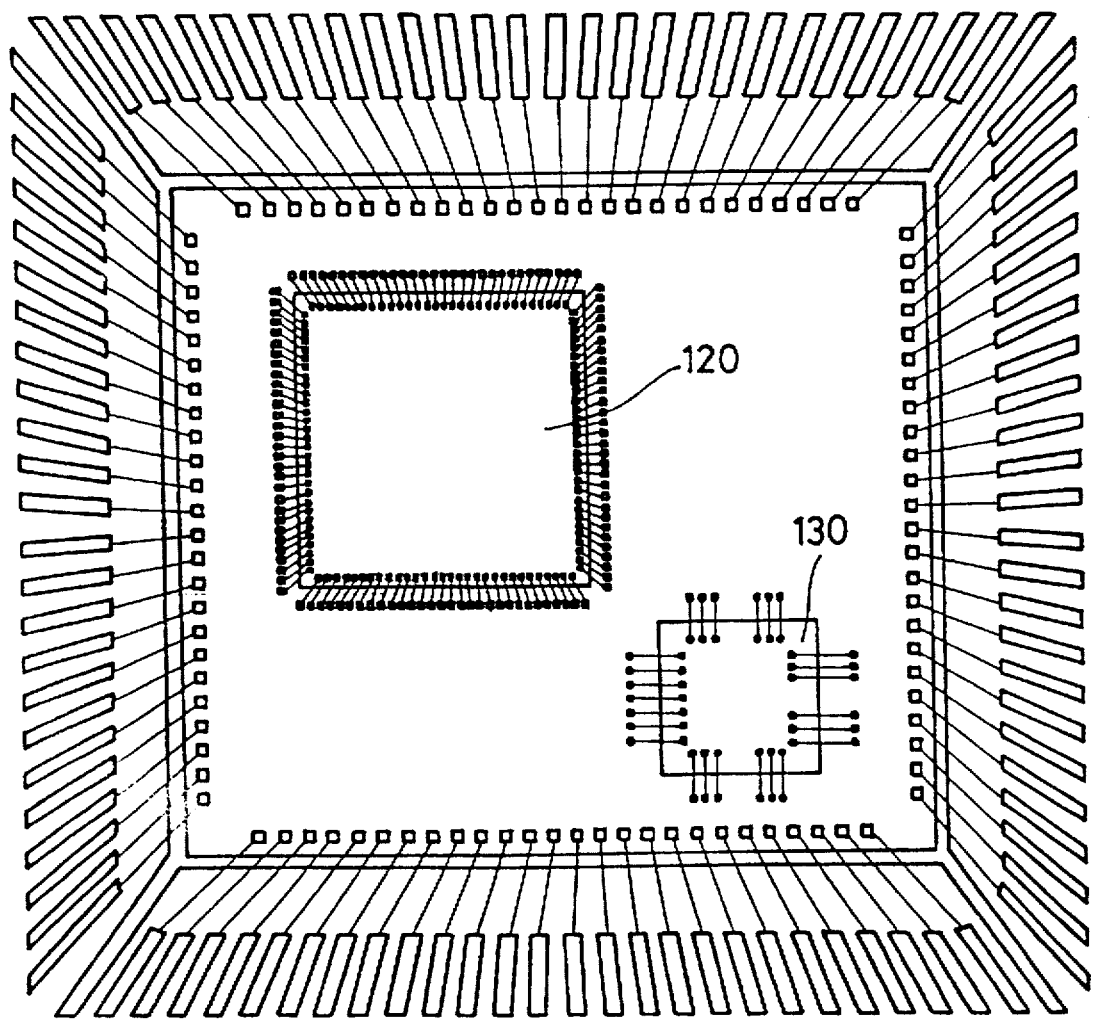
FIG. 1 is a top view of a conventional integrated circuit package.
Figure 2:
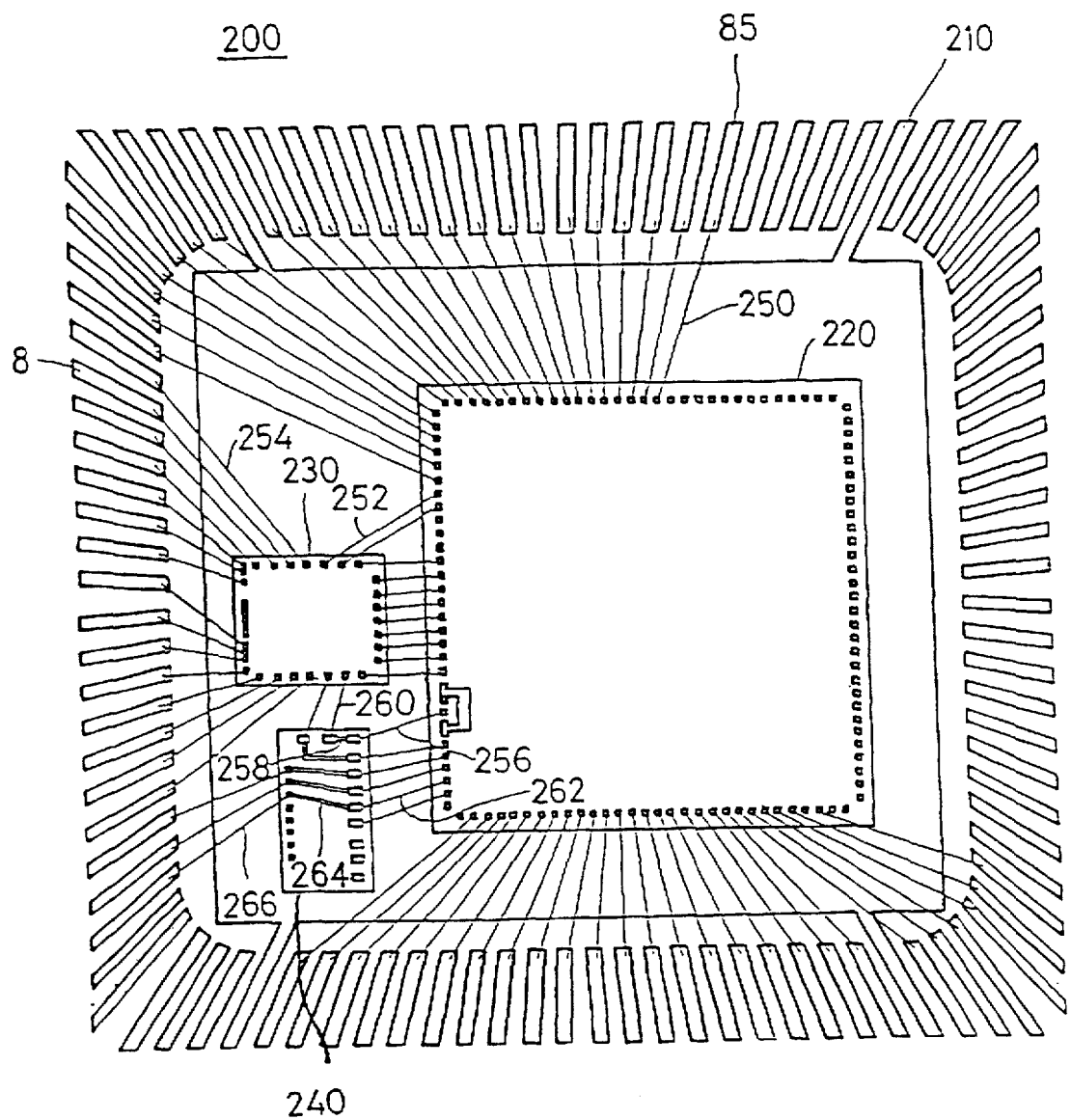
FIG. 2 is a top view of a first preferred embodiment of the new multiple-chip IC package according to the present invention.

FIG. 2 is a top view of the new multiple-chip IC package 200 according to the first preferred embodiment of the invention, which includes a leadframe 210 used to mount a number of chips including, for example, a DSP chip 220, a CODE chip 230, and a dummy chip 240 thereon. The DSP chip 220 and CODE chip 230 are chips manufactured by the UMC Corporation, but the multiple-chip IC package 200 of the invention disclosed here is not limited to the packaging of these chips. Other types of chips can be packaged. The leadframe 210 includes a number of pins on the four edges thereof for electrically interconnecting the multiple-chip IC package 200 to external circuits. On the inside, a number of wires such as copper wires, are used to interconnect between the three chips 220, 230, 240 and also connect to the same to the pins on the leadframe 210. These wires include those designated by the reference numerals 250, 252, 254, 256, 258, 260, 262, and 264, which will be used by way of example to depict the benefit of the less complicated wire-connection provided by this invention.

The DSP chip 220 is mounted on a fixed area on the leadframe 210 and has its bonding pads connected by a plurality of wires to corresponding pins on the leadframe 210 (as shown, for example, by the wire 250 that is connected to the pin 85). The CODE chip 230 is mounted on another fixed area on the leadframe 210 and has part of its bonding pads interconnected by a plurality of wires to corresponding bonding pads on the DSP chip 220 (as shown, for example, by the wire 252 that is connected to one bonding pad on the DSP chip 220) and part of its bonding pads connected by a plurality of wires to corresponding pins on the leadframe 210 (as shown, for example, by the wire 254 that is connected to the pin 8). So as to allow simplified wire interconnection between the DSP chip 220 and the CODE chip 230, it is a characteristic part of the invention that a dummy chip 240 is further provided in the multiple-chip IC package 200. The dummy chip 240 is a plate having a plurality of intermediate bonding pads thereon that can be used to simplify the interconnection between two bonding pads on respective chips, or between one bonding pad and one pin. For example, the dummy chip 240 can be used to connect one bonding pad on the DSP chip 220 to corresponding bonding pad on the CODE chip 230 via three wires 256, 258, and 260, and also used to connect the 6ther bonding pad on the DSP chip 220 to one pin on the edge of the leadframe 210 via three wires 262, 264, and 266.

Figure 3:
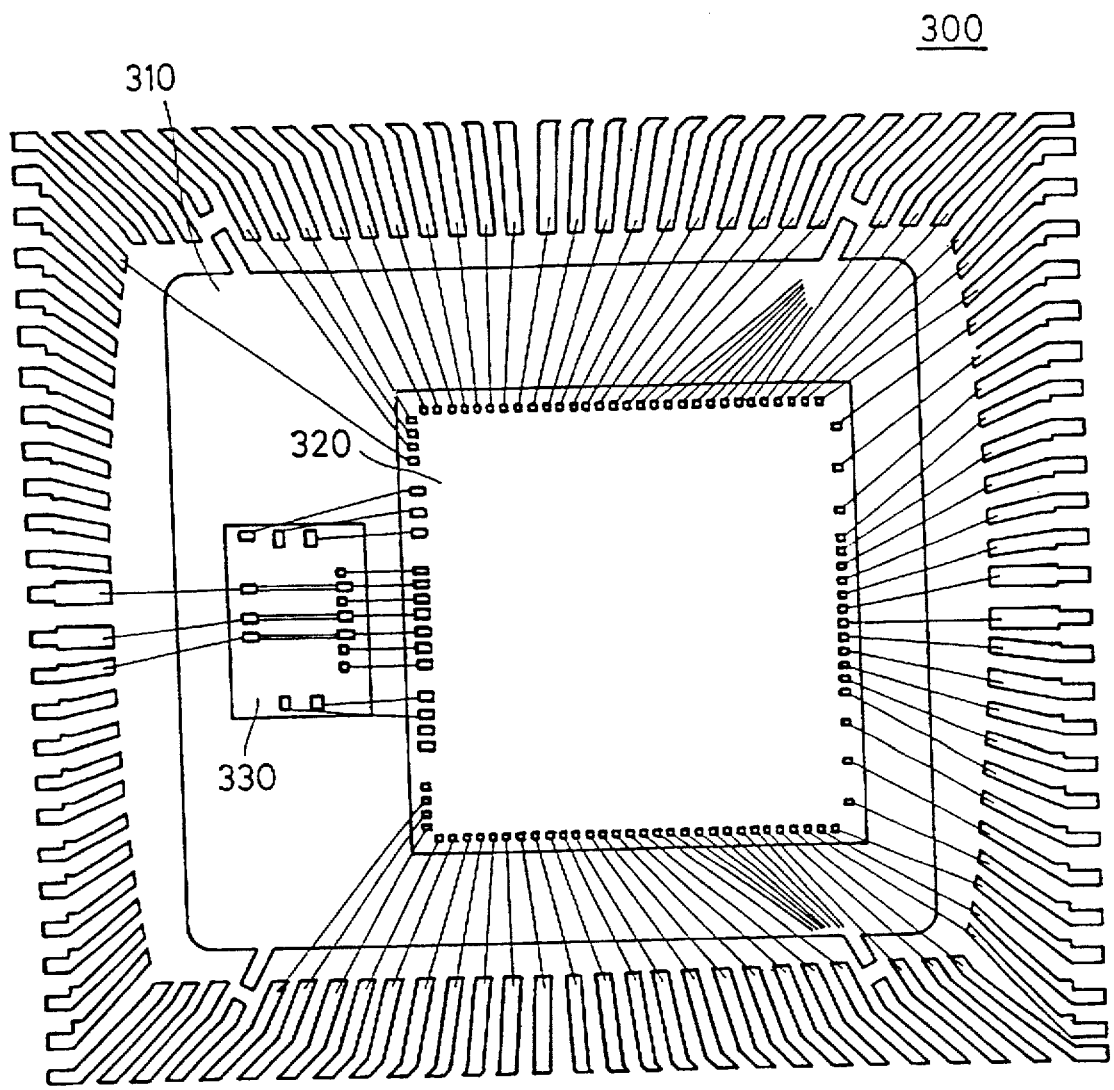
FIG. 3 is a top view of a second preferred embodiment of the new multiple-chip IC package according to the present invention.

FIG. 3 is a top view of a multiple-chip IC package 300 according to the second preferred embodiment of the invention, which includes a leadframe 310 used to mount a chip 320 thereon. This IC package 300 further includes a dummy chip 330 which serves as a bridge between one side row of bonding pads on the chip 320 and one side row of pins on the edge of the leadfame 310. The dummy chip 330 includes internally connected wires between the bonding pads thereon in a predetermined one-to-one manner. This allows the bonding wires that are used to connect the bonding pads on the chip 320 to the pins to be reduced in length and complexity, i.e., the wire bonding process needs just to apply a first group of short wires to connect between chip and the dummy chip and then a second group of short wires to connect between the dummy chip and selected pins on the leadframe 310.

In conclusion, the provision of the dummy chip allows the interconnection between chips and pins to be simplified so that the bonding wires can be reduced in length and complexity of configuration. The dummy chip in addition has the following benefits. First, since designing ICs with reduced feature size on PCB of polyimide or glass epoxy is a complex procedure and thus quite costly to implement, the provision of at least one dummy chip in the IC package allows a significant reduction in the complexity of the configuration of bonding wires. The manufacturing cost can thus be substantially reduced to a level of about 1% of that required by the prior art. Second, the dummy chip is very simple to design and allows various manners of internal interconnection to suit the requirements of different types of chips. Third, it is easier to connect the bonding pads on the dummy chip rather than connecting wires on PCB. Manufacturing cost is thus low.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A multiple-chip IC package, comprising:

a leadframe having a plurality of pins on the edges thereof;

at least one IC chip mounted on a first area on said leadframe, said IC chip having a plurality of first bonding pads thereon;

at least one dummy chip mounted on a second area on said leadframe, said dummy chip having a plurality of second bonding pads thereon;

a plurality of first wires for interconnecting a selected group of first bonding pads on said IC chip to a first selected group of second bonding pads on said dummy chip;

a plurality of second wires for interconnecting said first selected group of second bonding pads to a second selected group of second bonding pads on said dummy chip; and a plurality of third wires for interconnecting said second selected group of second bonding pads on said dummy chip to a selected group of pins on said leadframe.

2. The multiple-chip IC package of claim 1, wherein the first group of second bonding pads are connected to the second group of second bonding pads on the dummy chip in a predetermined one-to-one manner.

3. The multiple-chip IC package of claim 1, wherein the wires are copper wires.

4. A multiple-chip IC package, comprising:

a lead frame having a plurality of pins on edges thereof;

an IC chip mounted on a first area of the lead frame, the IC chip having a plurality of first bonding pads thereon;

a dummy chip mounted on a second area of the lead frame, the dummy chip having a plurality of second bonding pads thereon, the second group of bonding pads including
a first selected group of the second bonding pads, and
a second selected group of the second bonding pads, electrically connected to the first selected group of the second bonding pads;

a plurality of first wires for interconnecting a selected group of the first bonding pads to the first selected group of the second boding pads; and a plurality of second wires for interconnecting the second selected group of the second bonding pads to a selected group of the pins on the lead frame.

5. The multiple-chip IC package of claim 4, wherein the dummy chip includes electrical connectors connecting the first group of the second bonding pads to the second group of the second bonding pads in a predetermined one-to-one manner.

6. The multiple-chip IC package of claim 4, wherein the first and second wires are copper wires.

7. The multiple-chip IC package of claim 6, wherein the first and second wires and the electrical connections are copper wires.

* * * * *